US008621322B2

(12) United States Patent
Prasad et al.

(10) Patent No.: US 8,621,322 B2
(45) Date of Patent: Dec. 31, 2013

(54) DATA INTERLEAVER

(75) Inventors: Mohit K. Prasad, Austin, TX (US);
Clark H. Jarvis, Pflugerville, TX (US)

(73) Assignee: FreeScale Semiconductor, Inc., Austin, TX (US)

(*) Notice: Subject to any disclaimer, the term of this patent is extended or adjusted under 35 U.S.C. 154(b) by 1024 days.

(21) Appl. No.: 12/286,359

(22) Filed: Sep. 30, 2008

(65) Prior Publication Data

US 2010/0083072 A1   Apr. 1, 2010

(51) Int. Cl.
*H03M 13/27* (2006.01)
*H03M 13/53* (2006.01)

(52) U.S. Cl.
USPC .......................................... 714/762; 714/702

(58) Field of Classification Search
None
See application file for complete search history.

(56) References Cited

U.S. PATENT DOCUMENTS

| | | | |
|---|---|---|---|
| 5,537,429 A * | 7/1996 | Inoue | 714/755 |
| 5,586,256 A * | 12/1996 | Thiel et al. | 710/100 |
| 6,845,482 B2 | 1/2005 | Yao et al. | |
| 7,127,656 B2 | 10/2006 | Van Stralen et al. | |
| 2004/0146029 A1 * | 7/2004 | Tong et al. | 370/335 |
| 2005/0193308 A1 * | 9/2005 | Shin | 714/752 |
| 2007/0260777 A1 * | 11/2007 | Timpe et al. | 710/52 |
| 2008/0152131 A1 * | 6/2008 | Senoo | 380/42 |

FOREIGN PATENT DOCUMENTS

| | | |
|---|---|---|
| EP | 1555760 A1 | 1/2004 |
| EP | 1450494 A1 | 2/2004 |
| GB | 409133 A | 11/2003 |

* cited by examiner

*Primary Examiner* — Ajay Bhatia
*Assistant Examiner* — Dipakkumar Gandhi

(57) ABSTRACT

Methods and corresponding systems in an interleaver include loading K symbol data, in a linear order, into a matrix memory having (R·C) storage locations corresponding R rows and C columns. A sequence of interleaved addresses is produced for reading the K symbol data in an interleaved order from the matrix memory. Next, (R·C)−K interleaved addresses are queued in a first-in-first-out (FIFO) memory. After queuing (R·C)−K interleaved addresses in the FIFO memory, symbol data is output using the interleaved addresses in the FIFO memory to address and output the symbol data in the matrix memory in the interleaved order. The FIFO memory can contain at least 234 memory locations.

20 Claims, 5 Drawing Sheets

DATA INTERLEAVER

BACKGROUND

1. Field

This disclosure relates generally to data communication systems, and more specifically to systems for interleaving and de-interleaving data transmitted in a communication system, and corresponding methods therein.

2. Related Art

As the need or desire to quickly transmit (or otherwise transfer) large amounts of data increases, applications and systems continue to require higher data rates at a lower channel signal-to-noise ratio (SNR). To enable reliable data transmission for these applications and systems, more advanced coding and error correcting techniques are required.

One technique that can be used to increase the reliability of data transmission through a channel is interleaving. Interleaving can be used in digital data transmission to protect the transmission against burst errors. A burst error can be caused by noise or other signal perturbation that can overwrite, or change the value of, several bits in a row (e.g., contiguous or near contiguous bits) in a serial bit transmission. If too many bits in a row are overwritten, typical error correction schemes that expect errors to be more widely or uniformly distributed may be overwhelmed to the point that the burst error cannot be corrected.

In the process of interleaving data, an interleaver can be used to scramble the order of the bits that will be transmitted so that adjacent bits input into the interleaver are spaced further apart at the output of the interleaver. Scrambling the order increases the time between transmission of the previously adjacent bits so that a burst error that corrupts a group of bits will appear as isolated single-bit errors (e.g., a one-bit error in a channel symbol or data word) after being de-interleaved in the receiver. Such single-bit errors, which may be called random errors, are more easily corrected by the decoder.

Recently, convolutional codes have been combined with interleaving in order to further mitigate the effects of errors introduced to transmitted data in the channel. Convolutional codes introduce redundancy into the transmitted data so that in a transmitted data packet the value of each bit is dependent on earlier bits in the sequence. Still more advanced communication systems use multiple component codes that encode the data packet more than once, either in parallel or in series. An example in the prior art is "Turbo coding," which is an error correction scheme that uses at least two concatenated recursive systematic convolutional coders in parallel. The first encoder encodes the input bits of a code block in sequence (i.e., without changing the order prior to encoding), while the second encoder encodes an interleaved version of the bits in the code block. In a Turbo encoder the interleaver is used to generate a different sequence of coded bits. An interleaver to combat burst errors can also be used in communication systems that use Turbo encoders-decoders for error correction. In a communication system that uses a Turbo code according to a Third Generation Partnership Project (3GPP) standard, the Turbo interleaver supports code block sizes from 40 to 5114 bits. Groups of interleavers are defined by a parameterized definition that depends on the number of bits in the code block.

In the receiver, a Turbo decoder can use a Maximum a-priori (MAP) decoder. The symbols received by the receiver, which can be represented by LLR (log-likelihood ratio) symbols, are input into the MAP decoder. Symbols are available either in a sequential or an interleaved manner. Interleaved symbols can be de-interleaved during alternate iterations of the Turbo decoder. For maximum efficiency, the map decoder should have symbols input at a constant rate, such as one times the clock rate (i.e., 1× clock rate). The interleaver can introduce latencies between adjacent symbols of the un-interleaved sequence at instances where the interleaver must skip, or discard, certain data that should not be input into the map decoder. In some prior art interleavers, the clock rate is increased to some multiple of the symbol rate (e.g., m times the clock rate, where in many cases m is equal to 2) to give the interleaver clock cycles that can be used to skip data.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
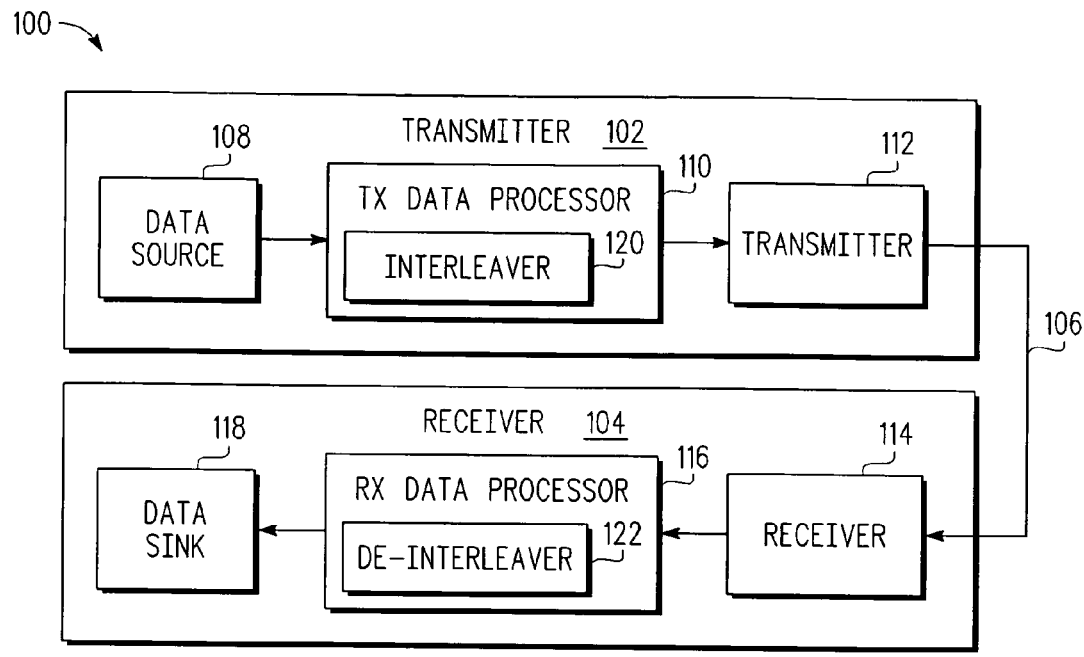
FIG. 1 is a high-level block diagram of a communication system, or a data processing system, that can be used to transmit or transfer interleaved data through a channel in accordance with one or more embodiments.

Referring to FIG. 1, there is depicted a high-level block diagram of communication system 100 (or a data processing system), which can be used to transfer or transmit data in accordance with one or more embodiments. Communication system 100 can include transmitter 102 and receiver 104, which can be used to transmit or transfer data through channel 106. The medium of channel 106 can be wired or wireless, or another suitable medium. For example, if channel 106 is wireless, communication system 100 can be implemented with a satellite communication system, or with a wireless mobile communication system, such as a cellular telephone system, or the like. If channel 106 is wired, communication system 100 can be implemented with a cable distribution system, a wired network, or the like.

Whatever medium is used, there is a possibility that the channel symbols transmitted through channel 106 will be affected by noise that can cause a transmission error. A "burst error," for example, can overwrite, or change the value of, several bits in a row (i.e., contiguous or near contiguous bits) in a serial bit transmission. If too many bits in a row are overwritten, an error correction scheme used in receiver 104 may be overwhelmed to the point that the burst error cannot be corrected.

In the embodiment of FIG. 1, data source 108 can be coupled to transmit data processor 110. In various embodiments, data source 108 can be data in a data file, data representing speech or video, data representing a website, or other similar data sources. Data to be transmitted can be provided by data source 108 to transmit data processor 110, which can be used to encode and otherwise process the data in preparation for transmission.

As part of transmit data processor 110, interleaver 120 can be used to interleave a block or packet of data prior to transmission in order to prevent or mitigate the effect of a burst error in transmission channel 106. Interleaving the data adds time diversity to the data transmission. Schemes for interleaving data can generally have these stages: first, writing the symbol data into a matrix memory (i.e., a memory representing a two-dimensional array having matrix elements arranged in R rows by C columns) in linear order (e.g., in row-by-row order); second, permuting the matrix by interchanging the rows (i.e., inter-row permutation), or interchanging the columns (i.e. intra-row permutation), or both; and third, reading from the R×C matrix memory in column-by-column order, typically beginning with the upper left most element of the array. The basic result of interleaving is spacing contiguous input bits further apart in time so that corruption of bits or symbols in the channel will not corrupt adjacent bits after de-interleaving.

After processing the data packet for transmission, the data is passed to transmitter 112, which can modulate and amplify the data for transmission. If Channel 106 is a wireless channel, transmitter 112 can up convert the data to produce modulated radio frequency signals for transmission from an antenna. In another embodiment, the data can be modulated for transmission over a coaxial cable, or over twisted-pair, or another suitable wire.

Once a modulated signal has passed through channel 106, receiver 114 can be used to demodulate a received signal to produce a baseband signal. The baseband signal can be passed to receive data processor 116, which can be used to decode and otherwise process the signal using processes that correspond to processes that were performed in transmit data processor 110. Thus, de-interleaver 122 can be used to reverse, or undo, the interleaving performed by interleaver 120. Note that "de-interleaving" can be considered an "interleaving" process wherein the permutations are performed in the reverse order to recover data, e.g., as it existed prior to interleaving. Thus, for example, a de-interleaver may perform permutations of the columns followed by permutations of the rows, which is the reverse order of the permutations performed in the interleaver.

After the demodulated data has been processed by receive data processor 116, data can be output to data sink 118. If communication system 100 has functioned properly, and the noise in channel 106 can be tolerated, the data in data sink 118 will match the data in data source 108.

Figure 2:
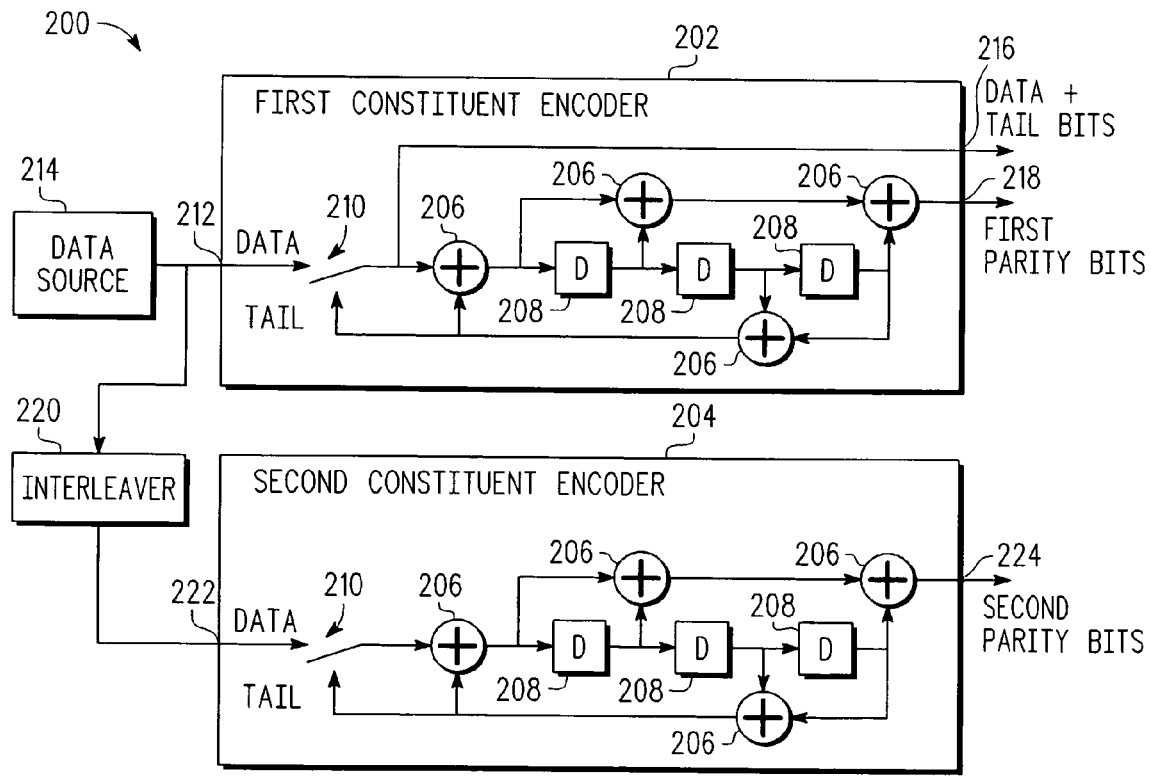
FIG. 2 is a high-level block diagram of a Turbo encoder that can be used for encoding symbol data using an interleaver in accordance with one or more embodiments.

With reference now to FIG. 2, there is depicted a high-level block diagram of a turbo encoder 200, which can use an interleaver in accordance with one or more embodiments. Turbo coding (i.e. turbo encoding and turbo decoding) has been adopted by many standards organizations, such as the European Telecommunications Standards Institute (ETSI) and the International Telecommunications Union (ITU), for use in communication systems, such as the communication systems described in the "3GPP standard" and the "3GPP2 standard." Turbo encoder 200 can be implemented as part of the data processing that occurs in transmit data processor 110 in transmitter 102. In FIG. 2, Turbo encoder 200 can include two simple 8-state convolutional encoders, which can be referred to as "constituent" encoders, shown as first constituent encoder 202 and second constituent encoder 204.

First and second constituent encoders 202 and 204, which are generally known, can each include a plurality of adders 206 and memory registers 208 that are configured to encode an input bit as a function of bits stored in memory registers 208. In one embodiment, two systematic recursive convolutional encoders can be configured to produce a Parallel Concatenated Convolutional Code (PCCC) with constraint length K=4. Switch 210 can be used to flush or reset the encoder with a series of "tail bits" at the end of a data block so that the encoder will be in a known state before beginning to encode a next data block.

First constituent encoder 202 can receive input bits at input 212 from data source 214. The input bits from data source 214 can be grouped as a data block or data packet. In some embodiments, a data block can be from 40 bits to 5114 bits long. First constituent encoder 202 can output the original input bits along with the tail bits at output 216, and can output first parity bits at output 218.

Input bits from data source 214 can also be input into interleaver 220, which can perform an interleaving function to scramble the bit ordering in accordance with one or more embodiments. According to the 3GPP specification (and similar specifications for other standards), interleaver 220 can interleave data blocks from 40 to 5114 bits long. Interleaved bits from interleaver 220 can then be input into second constituent encoder 204 at input 222. Second parity bits, which are encoded from interleaved data bits, can then be output from second constituent encoder 204 at output 224. Thus, the data sent across the channel using Turbo coding is the original bitstream (plus tail bits), the first parity bit stream from first constituent encoder 202, and the second parity bit stream from second constituent encoder 204, which makes the 3GPP turbo encoder a rate 1/3 encoder, where one bit input produces three bits output. Other Turbo coders may be configured differently, and have different rates. In some embodiments, the parity bits may be punctured to produce a higher-rate coder (i.e., to produce a code stream with fewer code bits).

Figure 3:
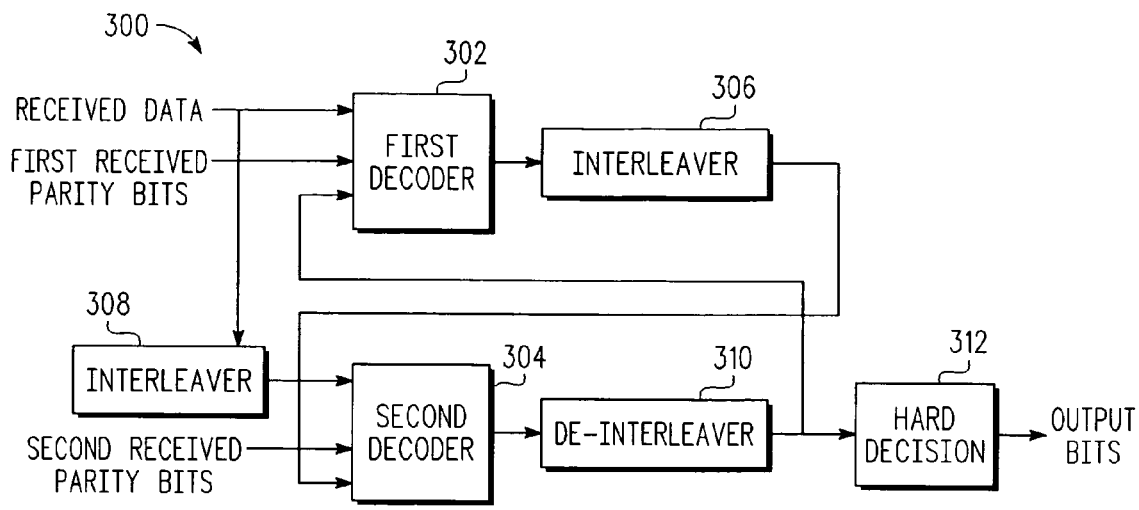
FIG. 3 is a high-level block diagram of a Turbo decoder that can be used for decoding received symbol data using an interleaver and a de-interleaver in accordance with one or more embodiments.

Referring now to FIG. 3, there is depicted a high-level block diagram of Turbo decoder 300, which can use an interleaver and a de-interleaver in accordance with one or more embodiments. As shown in FIG. 3, Turbo decoders operate in an iterative fashion, with two decoder blocks (e.g., first decoder 302 and second decoder 304), which correspond to the first and second constituent encoders 202 and 204 in FIG. 2. First decoder 302 outputs a likelihood ratio, which is a ratio of the probability of the bit being a 0 divided by the probability of the bit being a 1. To produce the likelihood ratio, first decoder 302 operates on received data and first received parity bits (e.g., soft values from a demodulator) that were produced by first constituent encoder 202 (see FIG. 2). The likelihood ratio (e.g., estimate) output by first decoder 302, which can be a log-likelihood ratio (LLR) or other monotonic metric, can then be interleaved in interleaver 306 and input into second decoder 304, along with interleaved received data (i.e., data that has been interleaved by interleaver 308), and the second received parity bits, which were produced by second constituent encoder 204 (see FIG. 2). The estimate output by second decoder 304 can be de-interleaved (i.e., processed to reverse the interleaving process) by de-interleaver 310, in accordance with one or more embodiments, and fed back into first decoder 302.

A passing of data through the first and second decoder blocks is considered one iteration. Turbo decoder 300 can repeat a fixed number of iterations, or repeat iterations until it is determined that no further iterations will improve the bit error rate (BER) for that received data block. After the iterations are complete, the original data bits can be recovered by making a hard decision on the last soft output at hard decision function 312.

The algorithm within first and second decoder blocks 302 and 304 operates on soft inputs (i.e., a probability estimate comprising several bits output by the demodulator) to produce soft outputs. In one embodiment, a Maximum A-Posteriori probability (MAP) algorithm can produce superior BER performance. The performance of a Turbo decoder can approach the theoretical Shannon's limit over a channel influenced by Gaussian noise.

Thus, interleavers, and de-interleavers, are important components of Turbo encoders and Turbo decoders. Additionally, interleaving and de-interleaving can be considered conversely related with interleaving scrambling or reordering the data, and de-interleaving putting the data back in the original order, assuming algorithms in the interleaver and de-interleaver for permuting the data are complementary. For example, interleaving can write data into memory in a sequential or linear order, then read it according to an interleaved address order, while de-interleaving can write data according to the interleaved address order, then read it in a sequential order.

In Turbo decoder 300, symbol data that are input into first and second decoders 302 and 304 are available in sequential order and in interleaved order. The interleaving or de-interleaving process used to properly order the input data can introduce latencies between adjacent symbols in the interleaved and un-interleaved streams. For maximum power efficiency and reduced circuit complexity, first and second decoders 302 and 304 should input symbols at a constant rate (e.g., 1× the Turbo decoder clock rate).

In the prior art, interleavers (and similarly de-interleavers) used a higher clock rate (e.g., a 2× clock rate) in order to output symbol data at every clock cycle to provide the input of the MAP decoders a constant input stream. By providing symbol data at every input clock cycle, decoder design can be simplified because the decoders do not need additional circuitry for delaying or stalling while waiting for an output from an interleaver. Using, for example, a 2× clock rate, the interleaver could have time, or extra clock cycles, to skip over filler data when an R×C matrix of the interleaver was not completely filled. When a 2× clock rate is used as a solution to provide symbol data at every input clock, the Turbo decoder can have the disadvantage of distributing higher clock rates in various parts of the Turbo decoder, which can require additional and expensive circuit design techniques, and significantly increase power consumption of the circuit. When Turbo coding circuits are used in portable devices, it is important to reduce power consumption in order to increase battery life, and to allow the devices to be smaller because they can use smaller batteries.

Figure 4:
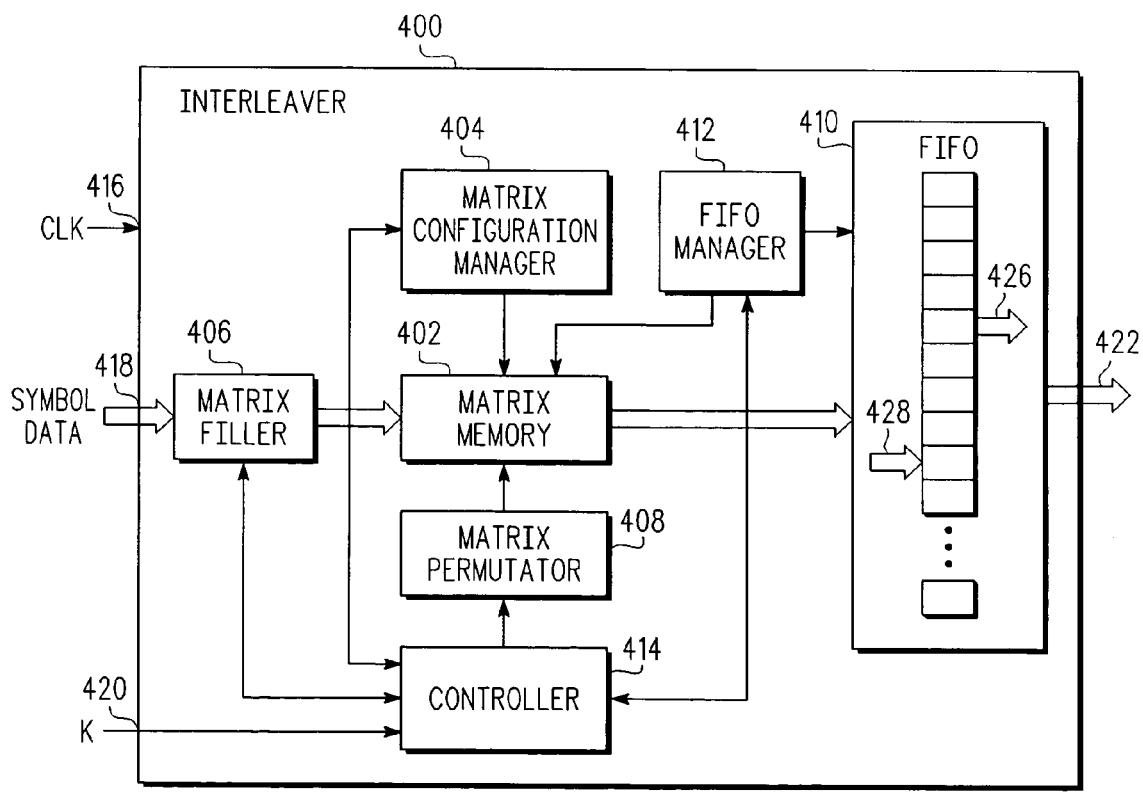
FIG. 4 is a high-level block diagram of an interleaver in accordance with one or more embodiments.

Referring now to FIG. 4, there is depicted a more detailed block diagram of an implementation of an interleaver, such as interleaver 120 (and similarly de-interleaver 122, see FIG. 1) in accordance with one or more embodiments. As shown in the embodiment of FIG. 4, interleaver 400 is implemented using functions that can move symbol data in memory to accomplish the interleaving. Note that in another embodiment, described below with reference to FIG. 5, the interleaver can be more abstractly implemented as a function or functions that calculate addresses of symbol data in order to accomplish the interleaving. Thus, in some embodiments, such as the embodiment of FIG. 4, symbol data stored as elements of matrix memory 402 can be permuted by moving the data (i.e., reading from one memory location, or matrix element, and writing to another). In other embodiments, such as the embodiment of FIG. 5, the matrix memory can be permuted by calculating addresses in the matrix memory in an order or sequence that can be used to recall and output symbol data in an interleaved order, which interleaved order duplicates the processes used in the embodiment of FIG. 4, wherein data is input in a first order, permuted, and output in a second order.

FIG. 4 shows that interleaver 400 can include matrix memory 402, which can be implemented with memory having storage locations that can be allocated as elements in a two-dimensional memory array. Memory matrix 402 can be coupled to matrix configuration manager 404 for configuring memory 402 as an array of R rows and C columns, wherein the R and C are integers.

Matrix filler 406 can be coupled to matrix memory 402 for receiving symbol data from input 418 and storing such symbol data in an appropriate element in matrix memory 402. As symbol data is received, matrix filler 406 can fill matrix memory 402 in linear order beginning at the first element on the first row, and continuing row-by-row until K number of elements have been filled, wherein K is an integer corresponding to the number of symbols in a block or packet of data. In some embodiments, K can vary. In one embodiment of a 3GPP compliant communication system, K can be in the range from 40 to 5114. If all the elements in the R by C memory matrix are not completely filled by the K symbols, matrix filler 406 can fill the remaining (R·C)−K (R times C with K subtracted from the product) elements with "filler data" or "dummy data." In various embodiments, filler data can have a value, or other characteristic, that can be recognized or distinguished from actual symbol data that corresponds to a transmitted symbol.

In different embodiments, matrix memory 402 can be filled with various forms of symbol data. For example, the symbol data can be a binary 1 or 0 (i.e., a single bit) in embodiments where hard symbols are used. In other embodiments where soft symbols are used, the symbol data can be represented by a soft symbol comprised of several bits. In yet another embodiment, matrix memory 402 can be filled with addresses, or indexes, or pointers, that point to other memory locations (not shown) that contain the symbol data (e.g., the binary data or the soft bit data that is a value of an element in the matrix). Thus, it can be said that matrix memory 402 is loaded with "symbol-related data," wherein such symbol-related data can be the "symbol data" (wherein such symbol data can be single-bit binary data, or multiple-bit soft symbol data), or such symbol-related data can be an address or an index corresponding to, or associated with, the symbol data.

Matrix permutator 408 can be used to permute, or rearrange, or scramble, the symbol-related data stored in elements of matrix memory 402. In various embodiments, matrix permutator 408 can reorder or interchange rows (i.e., inter-row permutation), or reorder or interchange columns (i.e., intra-column permutation), or both. In some embodiments, such as embodiments in accordance with some 3GPP standards, the inter-row and intra-column permutations can depend upon the number of matrix elements K.

In order to ensure a consistent number of symbol data output from interleaver 400 in relation to every clock cycle (e.g., one symbol data output for each clock cycle), interleaver 400 can include first-in-first-out memory (FIFO memory) 410, which can be controlled by FIFO manager 412.

FIFO manager 412 can begin loading or queuing symbol-related data into FIFO memory 410 at an address pointed to by input pointer 428. Note that the loading of symbol-related data does not include loading filler data; filler data is skipped, or discarded, or otherwise prevented from being queued into FIFO memory.

Once an appropriate number of symbol-related data have been queued in FIFO memory 410, FIFO manager 412 can start outputting symbol data using symbol-related data stored at an address pointed to by output pointer 426. If the proper initial difference between input pointer 428 and output pointer 426 is selected, symbol data can be periodically and consistently output at interleaver output 422.

Controller 414 can be used to coordinate various functions within interleaver 400. For example, controller 414 can be coupled to input 420 to receive a signal representing K, the number of symbol data in a block or packet that will be interleaved. Controller 414 can be coupled to matrix configuration manager 404 in order to communicate the value of K, and initialize the configuration of the matrix array, which can, for example, include selecting the number of rows R and columns C in response to K.

Controller 414 can be coupled to matrix filler 406 for initiating the loading or filling of matrix memory 402, for initiating filling matrix memory 402 with an appropriate number of filler data, and for communicating the status of the filling operation. In response to status signals that indicate that the matrix memory has been configured and filled, controller 414, which can be coupled to matrix permutator 408, can initiate and monitor the progress of the matrix permutation process, and adapt the permutation to the value of K. FIFO manager 412 can be coupled to controller 414 for initiating the queuing of symbol-related data in FIFO memory, for communicating a number of initial symbol-related data queued into FIFO memory 410, and for initiating FIFO memory output once the initial symbol-related data have been queued.

Note that the structure of interleaver 400 can also function as a de-interleaver, wherein matrix permutator 408 performs a permutation that reverses the permutation performed in a corresponding interleaver.

Figure 5:
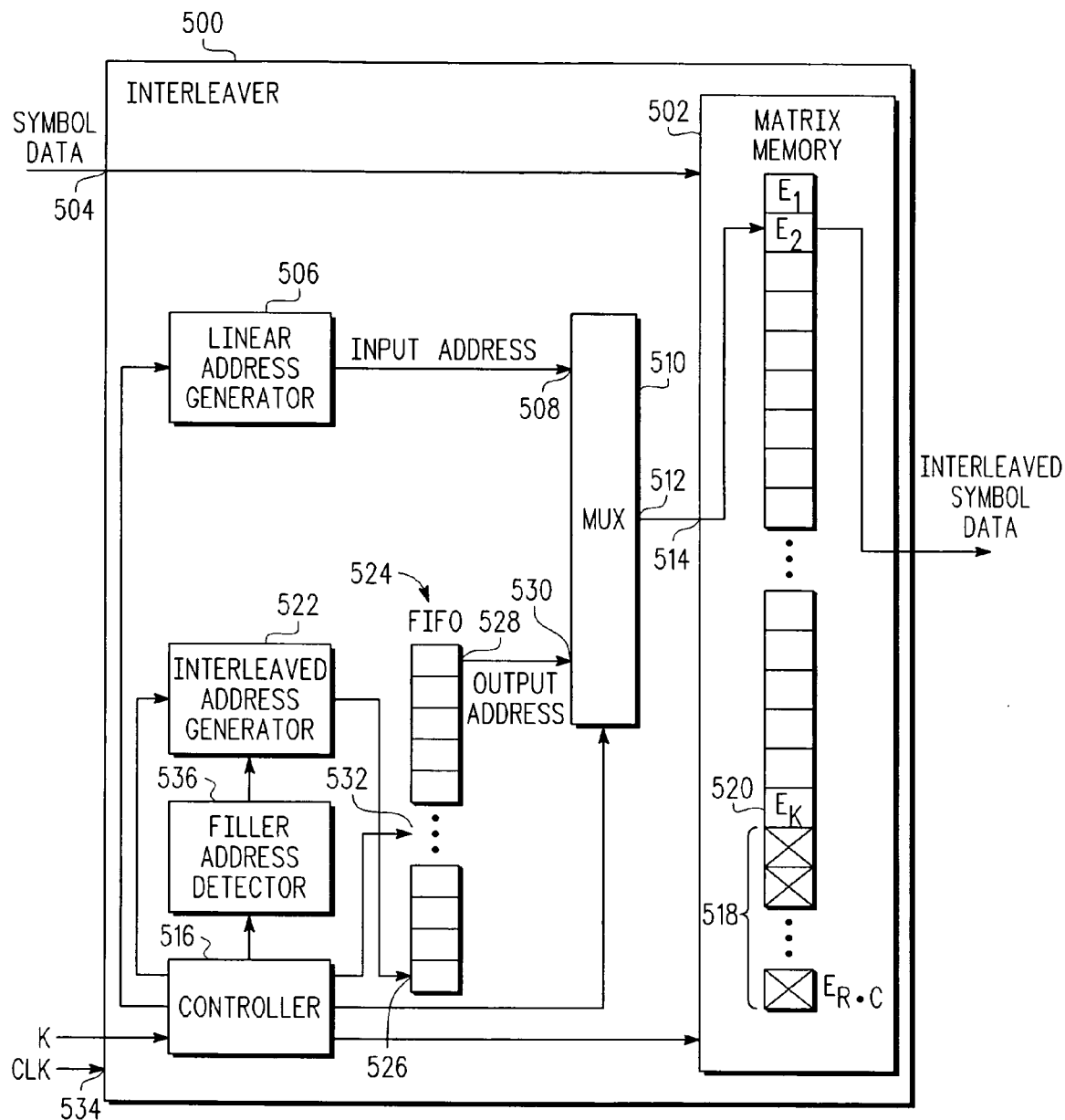
FIG. 5 is another high-level block diagram of an interleaver in accordance with one or more embodiments.

Referring now to FIG. 5, there is depicted a high-level block diagram of another embodiment of an interleaver, such as interleaver 120 (and similarly de-interleaver 122, see FIG. 1), in accordance with one or more embodiments. In the embodiment of FIG. 5, symbol data is stored linearly (e.g., in row-by-row order) in matrix memory, and recalled or read from matrix memory in interleaved order according to an interleaved address calculator.

As shown, interleaver 500 can include matrix memory 502 for storing symbol data, which can be input at input 504. In embodiments that support 3GPP, matrix memory 502 can be implemented with a number of storage locations or memory cells that can store K number of symbol data, wherein K can vary from 40 to 5114. Each of the K storage locations in matrix memory 502 can correspond to an element in an R by C matrix, wherein R is an integer specifying the number of rows in the matrix to be interleaved, and C is an integer specifying the number of columns in the matrix.

Linear address generator 506 can be used to calculate an input address for storage locations for loading or storing symbol data in matrix memory 502 in a linear (e.g., sequential, such as row-by-row) order. An input address that is output by linear address generator 506 can be coupled to first input 508 of multiplexer 510. Multiplexer output 512 can be coupled to address input 514 of matrix memory 502 to provide an address for reading or writing symbol data. Linear address generator 506 can be coupled to controller 516 to receive signals that initiate receiving and writing symbol data in matrix memory 502, and to receive other data, such as the value of K, which indicates the number of symbol data in the block of data to be interleaved.

In applications where the number of symbol data can vary, the K elements of matrix memory 502 may not completely fill an R by C matrix. For example, when K<R·C, there can be (R·C)−K unfilled elements 518 in the matrix. Each unfilled element 518 will have an input address greater than the input address of the last symbol data in the matrix, $E_K$, shown at 520. Note that in this embodiment, linear address generator 506 need not load any filler data into elements 518 in order to completely fill R by C matrix memory 502.

After matrix memory 502 has been filled with symbol data in linear address order, interleaved address generator 522 can be used to generate output addresses that are sequenced in interleaved order. Interleaved order is an order in which symbol data must be read from matrix memory 502 to duplicate the results of permuting the matrix array and reading and outputting symbol data in column-by-column order. Thus, the availability of addresses in interleaved order permits reading symbol data from matrix memory 502 in interleaved order. The determination of addresses in interleaved order can include executing algorithms or recalling predetermined data that corresponds to a sequence of initial addresses of the symbol data that are read in a column-by-column order from the matrix memory after the matrix memory is loaded in a row-by-row order and permuted by moving the symbol data in the (R·C) storage locations, wherein the initial address of each symbol data is the address of each symbol data at the loading of the K symbol data in matrix memory.

Addresses generated by address generator 522 can be input or queued into FIFO memory 524 at FIFO input 526. Under the control of a signal from controller 516, addresses can be output from FIFO memory 524 at FIFO output 528. FIFO output 528 can be coupled to second multiplexer input 530. In one embodiment, FIFO memory 524 can have a number of storage locations in the range from 234 to 256.

FIFO memory 524 can receive control signals from controller 516 at input 532. Such control signals can be used to configure FIFO memory 524, and set an initial number of symbol addresses that are queued or stored in FIFO memory 524 before FIFO memory 524 begins outputting addresses at FIFO output 528. Queuing an initial number of symbol addresses in FIFO memory 524 will ensure that interleaver 500 can output interleaved symbol data at a constant rate, such as one symbol data output per clock cycle, wherein the clock signal can be input into interleaver 500 at clock input 534. In one embodiment, the initial number symbol addresses stored can be equal to (R·C)−K, which can, in some embodiments, be in the range from 0 to 234.

In order to prevent addresses associated with filler data (or otherwise invalid addresses, such as addresses of unfilled locations 518) from being stored in FIFO memory 524, filler address detector 536 can be used to signal interleaved address generator 522 that such filler addresses should be ignored, or skipped, or discarded, and not loaded into FIFO memory 524. Filler address detector 536 can be coupled controller 516 for receiving control signals and data, such as K, which represents the total number of elements in a symbol data block. In one embodiment, filler address detector 536 can indicate that any symbol address greater than the address of element $E_K$ 520 (i.e., addresses in locations 512) is an invalid address which should be skipped and not loaded into FIFO memory 524.

Note that the structure of interleaver 500 can also function as a de-interleaver, wherein interleaved address generator 522 performs a permutation (i.e., a generation of addresses in de-interleaved order) that reverses the permutation performed in a corresponding interleaver.

Figure 6:
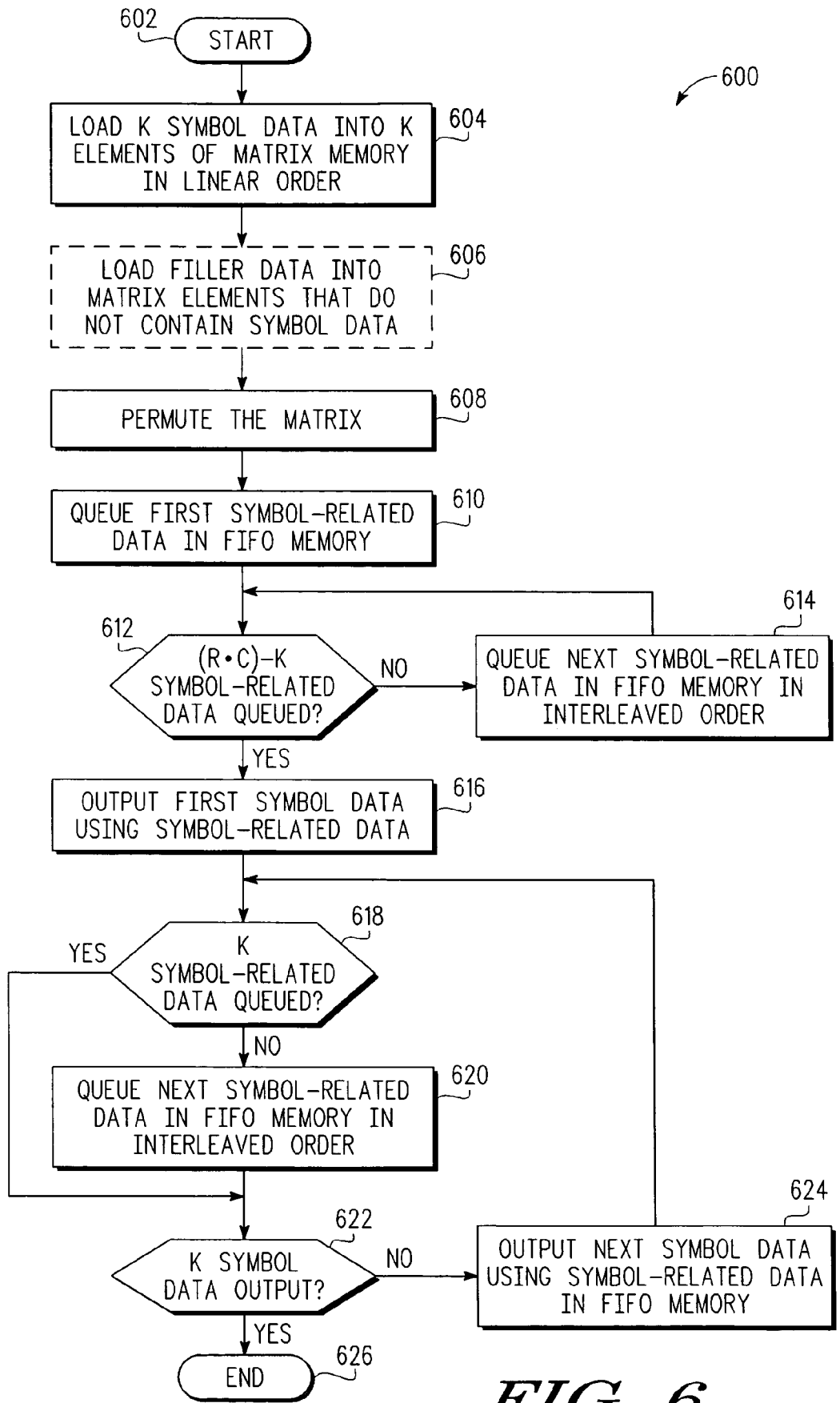
FIG. 6 is a high-level flowchart of one or more processes that can be implemented in an interleaver, such as interleaver 120 shown in FIG. 1, in accordance with one or more embodiments.

Referring now to FIG. 6, there is depicted a high-level flowchart 600 of one or more processes that can be executed in interleavers 120 (or, similarly, in de-interleaver 122), or 400, or 500, or another similar circuit with appropriate functionality, in accordance with the one or more embodiments. As shown, flowchart 600 begins at 602, and thereafter passes to 604, wherein the process loads K symbol data, in linear order (e.g., row-by-row order), into K elements of matrix memory having (R·C) storage locations corresponding to R rows and C columns, wherein K, R, and C are integers and K≤(R·C). In some embodiments, the values of R and C can depend upon the value of K. For example, in the 3GPP standard, a block of data for transmission can be from 40 bits to 5114 bits long, where R can be selected as 5, 10, or 20 depending upon the value of K. The number of columns C in the array can be selected based upon the number of rows R and the value of K. Loading the symbol data in linear order can correspond to loading symbol data in a row-by-row order.

In the embodiment of FIG. 4, the process of loading symbol-related data into matrix memory can be implemented with matrix filler 406, which receives symbol-related data at input 418 and stores the symbol-related data in matrix memory 402 in linear order, under the control of controller 414.

In the embodiment of FIG. 5, the process of loading symbol data into matrix memory can be implemented with linear address generator 506, which generates matrix memory input addresses of storage locations in linear order for storing symbol data from input 504 in matrix memory 502 under the control of controller 516.

In many cases, the K symbol-related data will not completely fill the R by C matrix. Therefore, at 606, the process can optionally load filler data into the (R·C)−K elements that do not contain symbol-related data. The fact that step 606 is optional is indicated by a dashed box in FIG. 6. Such filler data, which is illustrated in rows 710 and 712 of matrix 700 in FIG. 7, acts as placeholders for the permutation of the matrix, and as such, filler data should not be output for use in a decoder or other functional block.

In the embodiment of FIG. 4, the process of loading filler data can be implemented by matrix filler 406 under the control of controller 414, which can communicate the values of K, R, and C for the determination of the number of filler data. In an embodiment where the symbol data is an address or pointer, such filler data can be a nonexistent address (e.g., an out of range address) that can be quickly distinguished from an actual address.

In the embodiment of FIG. 5, loading filler data is not necessary, but unused locations in matrix memory are indicated at 518.

After loading the matrix with symbol-related data, the process can permute the matrix, as illustrated at 608. In various embodiments, rows can be permuted (or reordered, which can be referred to as inter-row permutation), columns can be permuted (which can be referred to as intra-row permutation), or both.

In the embodiment of FIG. 4, matrix memory 402 can be permuted by matrix permutator 408, which can move data in memory using read and write operations. Matrix permutator 408 can be coupled to controller 414 for receiving control signals and data needed to control the initiation and function of permuting the matrix memory. Inter-row and intra-row mutation can depend upon the value of K. In embodiments that use addresses or pointers as the symbol-related data, permutation can be implemented with a process of changing an index or subscript of the symbol data in order to change the symbol data addressed, or pointed to, instead of actually moving (i.e., reading and writing) the data. Matrix permutator 408 can be an address recalculator that can recalculate addresses stored in the matrix elements based on the dimensions R and C of the matrix, and the value of K.

In the embodiment of FIG. 5, permuting the matrix can be implemented by interleaved address generator 522 and filler address detector 536 under the control of controller 516. Given the number of rows R and the number of columns C, interleaved address generator 522 can determine an interleaved address order which represents an order in which symbol data must be output in order to achieve the interleaving function as if data was moved in matrix memory as described below in relation to FIGS. 7-9. Filler address detector 536 can prevent the output of filler data by preventing the use of an address (such as an address in range 518) that exceeds the address of element $E_K$ 520.

Figure 7:
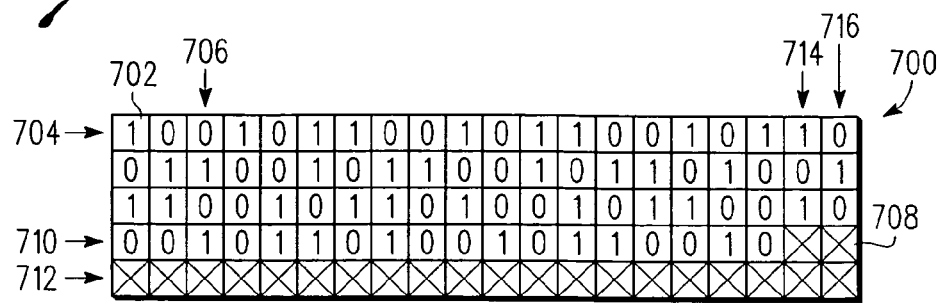
FIGS. 7, 8, and 9 are diagrams of a memory matrix in various stages of permutation in accordance with one or more embodiments.
Figure 8:
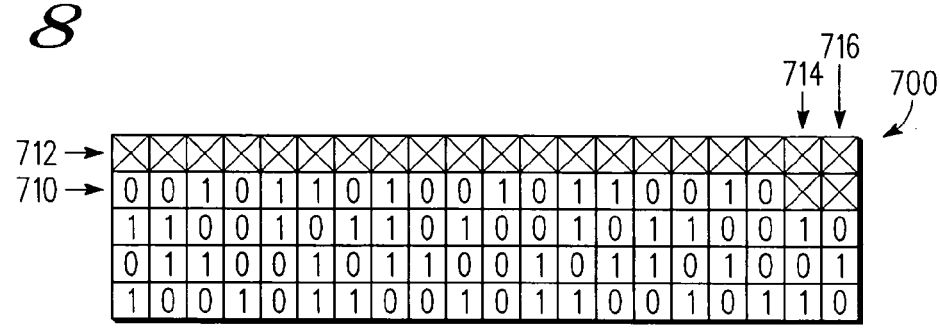
Figure 9:
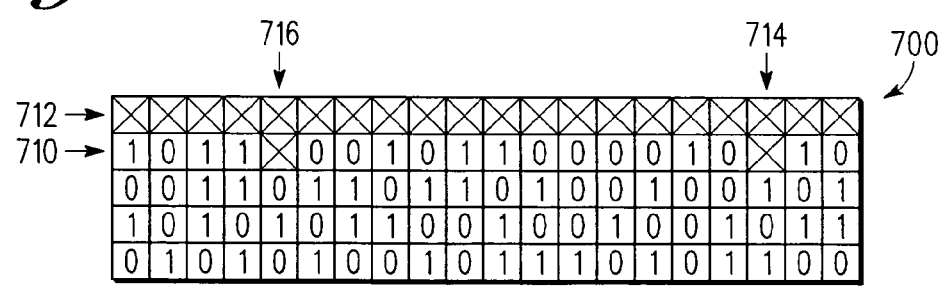

FIGS. 7, 8 and 9 illustrate inter-row and intra-row permutation. FIG. 7 shows matrix 700, which can have elements 702 arranged in rows (such as row 704) and columns (such as column 706). Symbol data can be loaded into matrix memory 700 in linear order, which can be row-by-row order, beginning at element 702. In order to completely fill the R×C matrix memory, filler data (such as filler data 708) has been loaded into two elements at the end of row 710, and in all the elements in row 712. Before matrix memory 700 has been permuted, rows 710 and 712 are the last two rows at the bottom of the matrix, and columns 714 and 716 are at the last two columns at the right side of the matrix.

Inter-row permutation changes the order of the rows in matrix memory 700. Following inter-row permutation, FIG. 8 shows that the rows have been reordered, and row 712 is now the first row in the matrix, and row 710 is the second row. Additionally, what was the first row in the matrix is now the last row, and the second row is now the fourth row, and the third row remains the third row. Essentially, in this example, the orders of the rows has been reversed. Note that columns 714 and 716 remain in the same place.

After permuting the rows, the process can permute the columns. FIG. 9 shows the state of matrix memory 700 after inter-row and intra-row permutation. In intra-row permutation, wherein columns are reordered according to a specified formula or algorithm, reordering is shown by the different placement of columns 714 and 716, while rows 710 and 712 remain in the same place. Note that after matrix memory 700 is permuted, filler data 708 can be located in various elements throughout the matrix.

After permuting the matrix at 608 in FIG. 6, the process can queue a first symbol-related data into FIFO memory, as depicted at 610. The interleaver can store symbol-related data in FIFO memory so that symbol-related data can be available, without delay or stalling, for output in response to the interleaver clock. In some embodiments, a number of symbol-related data equal to the number of filler data (e.g., a number equal to (R·C)−K) can be queued before any symbol-related data is output from FIFO memory. In some embodiments, FIFO memory has between 234 and 256 elements or memory locations for storing symbol data-related.

In the embodiment of FIG. 4, symbol data (or symbol-related data) can be queued in FIFO memory 410 by FIFO manager 412 under the control of controller 414.

In the embodiment of FIG. 5, addresses of symbol data in interleaved order can be queued in FIFO memory 524 by interleaved address generator 522 and filler address detector 536, under the control of controller 516.

Once a number of symbol-related data (such as symbol data or symbol addresses) have been queued in the FIFO memory, the process can begin outputting symbol data using the symbol-related data in the FIFO memory. As shown at 612, the process determines whether a sufficient number of symbol-related data has been queued in FIFO memory. In one embodiment, a sufficient number of symbol-related data queued can be (R·C)−K, which is a number of symbol-related data needed to allow the interleaver to skip or ignore filler data without delaying the output of interleaved symbol data relative to the interleaver clock. In some embodiments (and particularly in an embodiment for use in a 3GPP encoder or decoder) a maximum number of symbol-related data queued in FIFO memory can be 234. A size of FIFO memory can be greater than the maximum needed for an implementation of a particular specification, such as a FIFO having 256 storage locations, which can be a more standard memory size used in computer aided circuit design tools.

If, at 612, the number of symbol-related data queued is not sufficient, the process queues the next symbol-related data in the FIFO memory by selecting, in interleaved order the next symbol-related data (such as symbol data or symbol addresses) from the matrix memory, as illustrated at 614. Note that the process of selecting the next symbol-related data can include skipping, or discarding, filler data as it comes up in interleaved order so that filler data is not loaded into FIFO memory.

If sufficient symbol-related data has been queued in the FIFO, the process can begin outputting symbol data, as depicted at 616, wherein the process outputs the first symbol data using the symbol-related data from FIFO memory. If the symbol-related data is symbol data, the process outputs the symbol data from the FIFO memory. If, in another embodiment, the symbol-related data is a symbol address, the process outputs the symbol data from a memory that stores the symbol data using the symbol address from FIFO memory.

Next, the process determines whether all K symbol-related data have been queued in FIFO memory, as depicted at 618. If all K symbol-related data has not been queued, the process selects the next symbol-related data from matrix memory, in interleaved order, which can be column-by-column order, and queues the symbol-related data in FIFO memory, as illustrated at 620. If all K symbol-related data has been queued, the process can skip the queuing step at 620 and pass to 622.

At 622, the process determines whether all K symbol data has been output. If K symbol data has been output, the process of interleaving (or de-interleaving) a block of symbol data has been completed, and the process can terminate, as shown at 626. If all K symbol data has not been output, the process outputs the next symbol data using symbol-related data, as depicted at 624, and then iteratively passes to block 618.

The processes depicted in FIG. 6 can be iteratively performed, block after block, to interleave a block of symbol data (or conversely de-interleave a block of symbol data). For example, in FIG. 2, interleaving can be performed for every block of symbol data at interleaver 220. In Turbo decoder 300 in FIG. 3, in every iteration through the decoder, interleaving can be performed at interleavers 306 and 308, and de-interleaving can be performed at de-interleaver 310.

Using the techniques of interleaving and de-interleaving symbol data described above, an interleaver can output symbol data, while skipping over and ignoring filler data, in response to the system clock, without pausing or delaying once the output of symbol data has started (i.e., without a delay between outputting each of the K symbol data in response to the interleaved address generator generating an address of filler data in the matrix memory). This ability to provide a steady flow of interleaved symbol data is advantageous because it allows steady operation of other major functional blocks in a decoder, such sequentially arranged MAP decoders in a Turbo decoder. Also, interleaved data can be synchronized for parallel or substantially simultaneous processing with data that has not been interleaved, such as for processing various data streams required by a MAP decoder in a Turbo decoder.

Another advantage is that encoders and decoders that have such synchronized streams of interleaved and un-interleaved data can be operated at a lower clock rate, which means that encoders and decoders and other circuits that use interleavers and de-interleavers can use less power, produce less heat, and use a less complex design (e.g., use a less complex clock tree) that has fewer circuits with critical timing issues.

Although the invention is described herein with reference to specific embodiments, various modifications and changes can be made without departing from the scope of the present invention as set forth in the claims below. For example, while the techniques and apparatus for interleaving or de-interleaving may vary widely, one or more embodiments can be used in signal processing or communication systems applications. For example, the interleaving techniques set forth herein can be used in wireline or wireless transmitters or receivers (e.g., a cellular telephone or other wireless subscriber unit, a set-top cable TV receiver, a satellite receiver, or the like). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or an essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method in an interleaver comprising:
loading K symbol data, in a linear order, into a matrix memory having (R·C) storage locations corresponding to R rows and C columns;
queuing symbol-related data in a first-in-first-out (FIFO) memory, wherein the symbol-related data is queued in an interleaved order; and
after queuing (R·C)−K symbol-related data in the FIFO memory, outputting, before all symbol related data has been queued in the FIFO memory, the symbol data, in interleaved order, using the symbol-related data from the FIFO memory.

2. The method in an interleaver according to claim 1 wherein the queuing symbol-related data, and the outputting the symbol data using the symbol-related data from the FIFO memory, comprises:
queuing the symbol data in the FIFO memory in the interleaved order; and
after queuing (R·C)−K symbol data in the FIFO memory, outputting the symbol data, in the interleaved order, using the symbol data from the FIFO memory.

3. The method in an interleaver according to claim 1 wherein the queuing symbol-related data. and the outputting the symbol data using the symbol-related data from the FIFO memory, comprises:

queuing, in the FIFO memory in the interleaved order addresses of the storage locations in the matrix memory where the symbol data are stored; and after queuing (R·C) K addresses in the FIFO memory outputting the symbol data, in the interleaved order, from the matrix memory using the address in the FIFO memory.

4. The method in an interleaver according to claim 1 further comprising permuting the matrix memory by moving the symbol data in the (R·C) storage locations in the matrix memory.

5. The method in an interleaver according to claim 1 further comprising:
permuting the matrix memory by producing a sequence of interleaved addresses that corresponds to a sequence of initial addresses of the symbol data that are read in a column-by-column order from the matrix memory after the matrix memory is loaded in a row-by-row order and permuted by moving the symbol data in the (R·C) storage locations, wherein the initial address of each symbol data is the address of each symbol data at the loading of the K symbol data; and
wherein the queuing the symbol-related data comprises queuing the sequence of interleaved addresses in the FIFO memory.

6. The method in an interleaver according to claim 1 wherein the loading K symbol data comprises loading K bits of symbol data.

7. The method in an interleaver according to claim 1 wherein the loading K symbol data comprises loading K symbol data, wherein each of the K symbol data is represented by a group of soft bits.

8. The method in an interleaver according to claim 1 wherein the loading K symbol data comprises loading K addresses corresponding to K symbol data.

9. The method in an interleaver according to claim 1 wherein the queuing symbol-related data comprises queuing the symbol-related data in the FIFO memory, wherein the FIFO memory has storage locations for storing between 234 and 256 symbol-related data.

10. The method in an interleaver according to claim 1 wherein the queuing the symbol-related data comprises:
determining whether a selected matrix element contains the symbol-related data;
if the selected matrix element contains the symbol-related data, queuing the symbol-related data in a next storage location in the FIFO memory; and
if the selected matrix element contains filler data, selecting a next matrix element in a column-by-column order to locate a next symbol-related data for queuing in the FIFO memory.

11. The method in an interleaver according to claim 1 wherein the outputting the symbol data comprises outputting the symbol data, in the interleaved order, at a constant rate relative to an interleaver clock rate.

12. An interleaver comprising:
a controller;
a matrix memory for providing storage locations for K symbol data configured in R rows and C columns, wherein K, R, and C are integers and K≤(R·C);
a linear address generator coupled to the controller and the matrix memory for generating addresses of the storage locations for storing the K symbol data in the matrix memory in a linear order;
a first-in-first-out (FIFO) memory coupled to the controller and the matrix memory;

an interleaved address generator, coupled to the controller and the FIFO memory, for generating and storing addresses of the storage locations in the FIFO memory in an interleaved order; and a filler address detector coupled to the controller and the interleaved address generator for detecting an address of filler data in the matrix memory and in response thereto preventing loading of the address of the filler data in the FIFO memory, wherein the controller is configured to control storing the K symbol data in the matrix memory in the linear order, and outputting the K symbol data from the matrix memory in the interleaved order without a delay between outputting each of the K symbol data in response to the interleaved address generator generating an address of filler data in the matrix memory wherein the outputting the K symbol data begins after (R·C)−K and prior to all K of the addresses of the storage locations in the FIFO memory have been generated and stored.

13. The interleaver according to claim 12 wherein the FIFO memory comprises a FIFO memory for storing between 234 and 256 addresses of the symbol data.

14. The interleaver according to claim 12 wherein the interleaved address generator comprises an interleaved address generator for generating and storing the addresses of the storage locations in the FIFO memory in an order that corresponds to a sequence of initial addresses of the symbol data read in a column-by-column order from the matrix memory after the matrix memory has been loaded in a row-by-row order and permuted, wherein the initial address of the symbol data is an address of the symbol data at the storing in the row-by-row order.

15. The interleaver according to claim 12 further comprising a multiplexer for coupling the addresses of the storage locations output by the linear address generator and the FIFO memory to the matrix memory.

16. A method in an interleaver comprising:
loading K symbol data in a linear order in a matrix memory configured as R rows and C columns, wherein K, R, and C are integers;
producing a sequence of interleaved addreses for reading the K symbol data in an interleaved order from the matrix memory;
queuing (R·C)−K interleaved addresses in FIFO memory; and
after queuing the (R·C)−K interleaved addresses and before queuing all interleaved addresses in the FIFO memory, using the interleaved addresses from the FIFO memory to address and output the symbol data in the matrix memory in the interleaved order.

17. The method in an interleaver according to claim 16 wherein the queuing (R·C)−K interleaved addresses in the FIFO memory comprises queuing (R·C)−K interleaved addresses in a FIFO memory having between 234 and 256 storage locations.

18. The method in an interleaver according to claim 16 wherein the loading K symbol data in the linear order comprises loading K symbol data in a row-by-row order in the matrix memory.

19. The method in an interleaver according to claim 16 wherein the producing a sequence of interleaved addresses comprises:
producing a sequence of interleaved addresses that corresponds to a sequence of initial addresses of the symbol data that are read in a column-by-column order from the matrix memory after being loaded in a row-by-row order and permuted in the matrix memory, wherein the initial address of the symbol data is an address of the symbol data at the loading of the K symbol data.

20. The method in an interleaver according to claim 16 wherein the queuing (R·C)−K interleaved addresses in the FIFO memory comprises:
- determining whether a selected matrix element contains symbol-related data;
- if the selected matrix element contains the symbol-related data, queuing the symbol-related data in a next storage location in the FIFO memory; and
- if the selected matrix element contains filler data, selecting a next matrix element in a column-by-column order to locate a next symbol-related data for queuing in the FIFO memory.

* * * * *